United States Patent
Segawa (10) Patent No.: US 9,929,103 B2
(45) Date of Patent: Mar. 27, 2018

(54) MISALIGNMENT CHECKING DEVICE AND MANUFACTURING METHOD OF SEMICONDUCTOR DEVICE

(71) Applicant: TOSHIBA MEMORY CORPORATION, Minato-ku (JP)

(72) Inventor: Kazuhiro Segawa, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 235 days.

(21) Appl. No.: 14/744,453

(22) Filed: Jun. 19, 2015

(65) Prior Publication Data

US 2016/0223321 A1    Aug. 4, 2016

Related U.S. Application Data

(60) Provisional application No. 62/109,348, filed on Jan. 29, 2015.

(51) Int. Cl.
*G01B 11/27* (2006.01)
*H01L 23/544* (2006.01)
*H01L 21/66* (2006.01)
*G03F 7/20* (2006.01)
*H01L 27/11582* (2017.01)

(52) U.S. Cl.
CPC ........ *H01L 23/544* (2013.01); *G03F 7/70633* (2013.01); *H01L 22/12* (2013.01); *H01L 27/11582* (2013.01); *H01L 2223/5442* (2013.01); *H01L 2223/5446* (2013.01); *H01L 2223/54426* (2013.01)

(58) Field of Classification Search
CPC ............ H01L 23/544; H01L 27/11582; H01L 2223/5442; H01L 2223/54426; G03F 7/70633

See application file for complete search history.

(56) References Cited

U.S. PATENT DOCUMENTS

| 7,298,500 | B2 | 11/2007 | Sato et al. |
| 7,379,175 | B1* | 5/2008 | Stokowski ....... G01N 21/95607 356/237.5 |
| 7,864,308 | B2 | 1/2011 | Sato |
| 2004/0075842 | A1* | 4/2004 | Dunn ................ G01B 9/02019 356/511 |
| 2004/0165195 | A1* | 8/2004 | Sato ...................... G03F 9/7088 356/614 |

(Continued)

FOREIGN PATENT DOCUMENTS

| JP | 2004-239648 | 8/2004 |
| JP | 2009-192271 | 8/2009 |
| JP | 2012-253145 | 12/2012 |

*Primary Examiner* — Dominic J Bologna
(74) *Attorney, Agent, or Firm* — Oblon, McClelland, Maier & Neustadt, L.L.P.

(57) ABSTRACT

According to one embodiment, an optical element branches reflection light from a first mark and a second mark having different focus positions, a first imaging element captures an image of the first mark based on a first branch light branched by the optical element, a second imaging element captures an image of the second mark based on a second branch light branched by the optical element, and an arithmetic processing unit that calculates a misalignment between the first mark and the second mark based on a result of superimposition of the image of the first mark and the image of the second mark.

2 Claims, 9 Drawing Sheets

(56) References Cited

U.S. PATENT DOCUMENTS

| | | | |
|---|---|---|---|
| 2011/0205518 A1* | 8/2011 | Van De Kerkhof | G03F 7/70633 355/67 |
| 2012/0307226 A1 | 12/2012 | Maeda | |
| 2015/0324963 A1* | 11/2015 | Sezginer | G01N 21/8851 382/144 |
| 2016/0093040 A1* | 3/2016 | Sousa | G01N 21/956 382/149 |

* cited by examiner

MISALIGNMENT CHECKING DEVICE AND MANUFACTURING METHOD OF SEMICONDUCTOR DEVICE

CROSS-REFERENCE TO RELATED APPLICATIONS

This application is based upon and claims the benefit of priority from U.S. Provisional Application No. 62/109,348, filed on Jan. 29, 2015; the entire contents of which are incorporated herein by reference.

FIELD

Embodiments described herein relate generally a misalignment checking device and a manufacturinq method of semiconductor device.

BACKGROUND

With an increase in packing density, semiconductor devices have been developed in an attempt at finer patterning and further multi-layering. At checking of superimposition on a layered body in a lithography process, a wafer stage is vertically driven to align focus positions at the upper and lower sides of the layered body.

DISCLOSURE OF INVENTION

DETAILED DESCRIPTION

In general, according to one embodiment, a misalignment checking device includes an optical element, a first imaging element, a second imaging element, and an arithmetic processing unit. The optical element branches reflection light from a first mark and a second mark having different focus positions. The first imaging element captures an image of the first mark based on a first branch light branched by the optical element. The second imaging element captures an image of the second mark based on a second branch light branched by the optical element. The arithmetic processing unit calculates a misalignment between the first mark and the second mark based on a result of superimposition of the image of the first mark and the image of the second mark.

Exemplary embodiments of a semiconductor device and a manufacturing method of the semiconductor device will be explained below in detail with reference to the accompanying drawings. In the following description, a non-volatile semiconductor storage device is used as an example of the semiconductor device. The present invention is not limited to the following embodiments.

(First Embodiment)

Figure 1:
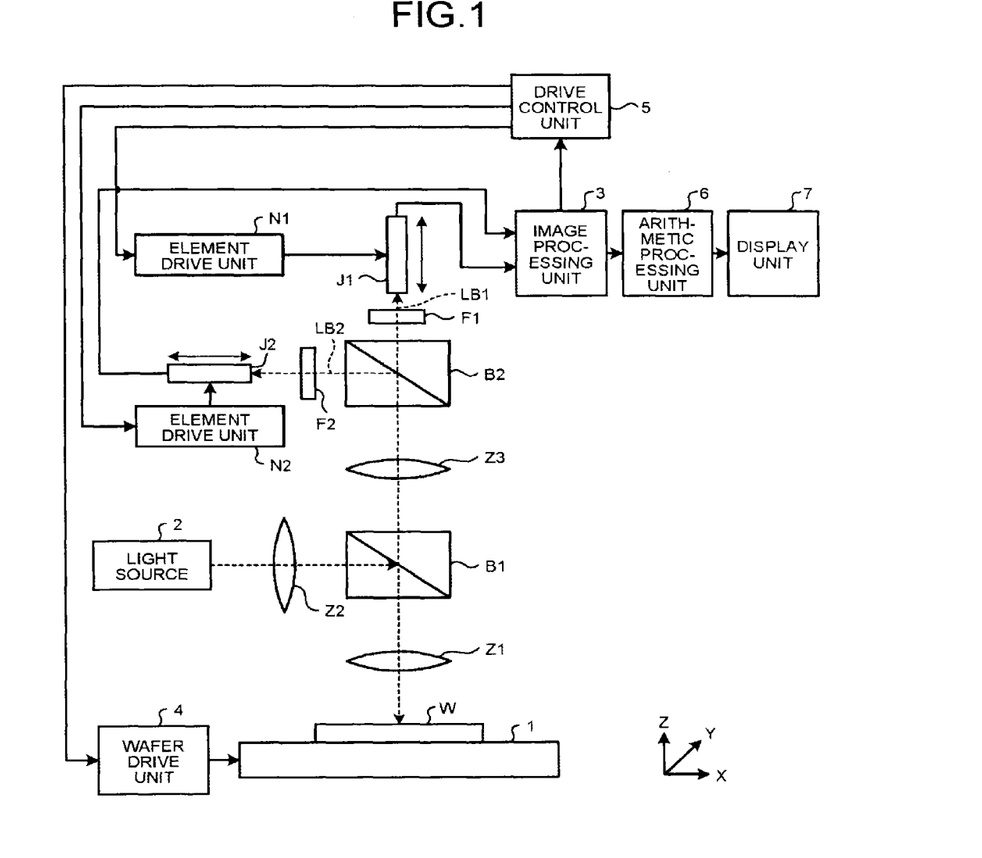
FIG. 1 is a schematic block diagram of a schematic configuration example of a misalignment checking device according to a first embodiment.

FIG. 1 is a schematic block diagram of a configuration example of a misalignment checking device according to a first embodiment.

Referring to FIG. 1, the misalignment checking device is provided with a wafer stage 1, a light source 2, an object lens Z1, an illumination lens Z2, an imaging lens Z3, a half mirror B1, a beam splitter B2, filters F1 and F2, imaging elements J1 and J2, element drive units N1 and N2, a wafer drive unit 4, a drive control unit 5, an image processing unit 3, an arithmetic processing unit 6, and a display unit 7. The wafer stage 1 holds a wafer W on an XY plane. The light source 2 generates illumination light to illuminate the wafer W. The wavelength of the illumination light can be set in the visible region or in the infrared region. The object lens Z1 collects the illumination light on the wafer W. The illumination lens Z2 collects the illumination light emitted from the light source 2. The imaging lens Z3 collects the illumination light on the imaging elements J1 and J2. The half mirror B1 reflects the illumination light emitted from the wafer W or lets the reflection light from the wafer W pass therethrough. The beam splitter B2 branches the reflection light from the wafer W. The imaging elements J1 and J2 capture images of patterns having different focus positions on the wafer W. The imaging elements J1 and J2 may be CCDs or CMOS image sensors. The filter F1 selects the wavelength suited for imaging by the imaging element J1. The filter F2 selects the wavelength suited for imaging by the imaging element J2. The element drive unit N1 drives the imaging element J1 in the direction of an optical axis of the imaging element J1. The element drive unit N2 drives the imaging element J2 in the direction of an optical axis of the imaging element J2. The wafer drive unit 4 drives the wafer stage 1 in an x-axis direction, y-axis direction, and z-axis direction. The drive control unit 5 controls driving of the element drive units N1 and N2 and the wafer drive unit 4. The image processing unit 3 performs image processing on the images captured by the imaging elements J1 and J2. The arithmetic processing unit 6 calculates a misalignment between patterns having different focus positions on the wafer W according to the images captured by the imaging elements J1 and J2. The display unit 7 displays the result of calculation by the arithmetic processing unit 6.

Figure 2A:
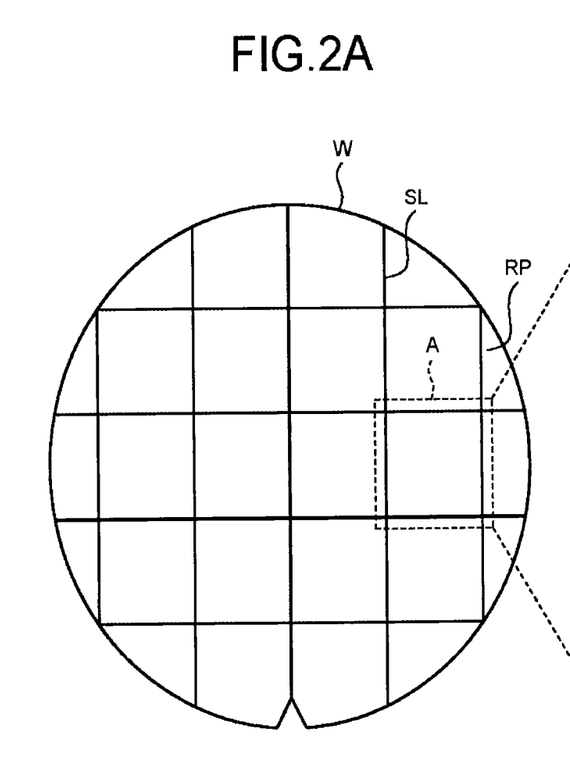
FIG. 2A is a plane view of a configuration example of a wafer to which the misalignment checking device illustrated in FIG. 1 is applied.
Figure 2B:
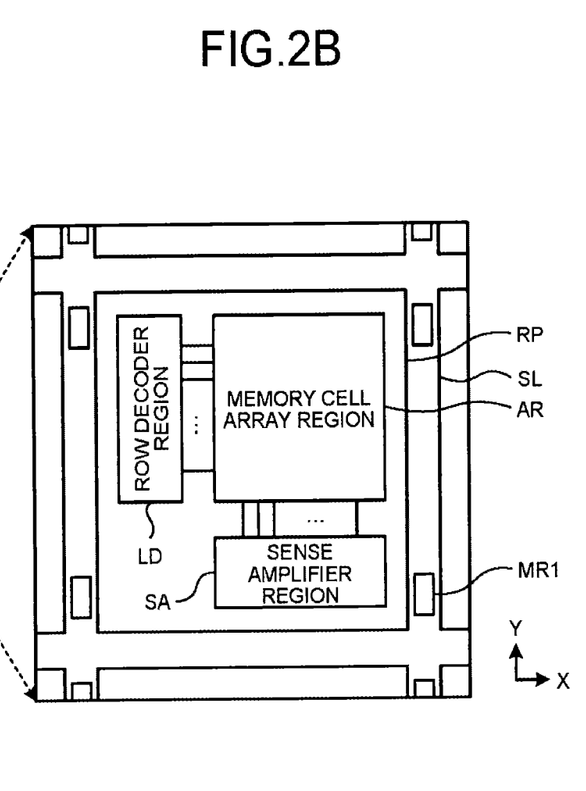
FIG. 2B is an enlarged plane view of a section A in FIG. 2A.

FIG. 2A is a plane view of a configuration example of a wafer to which the misalignment checking device illustrated in FIG. 1 is applied, and FIG. 2B is an enlarged plane view of a section A in FIG. 2A. In the example of FIG. 2B, a non-volatile semiconductor storage device is formed in a chip region RP.

Referring to FIG. 2A, the wafer W is divided by scribe lines SL into chip regions RP. As illustrated in FIG. 2B, each of the chip regions RP is provided with a memory cell array region AR, a row decoder region LD, and a sense amplifier region SA. Mark regions MR1 are provided on the scribe lines SL. Alignment detection marks are formed on the mark regions MR1 to detect a misalignment between an upper layer pattern and a lower layer pattern.

Figures 3A, 3E:
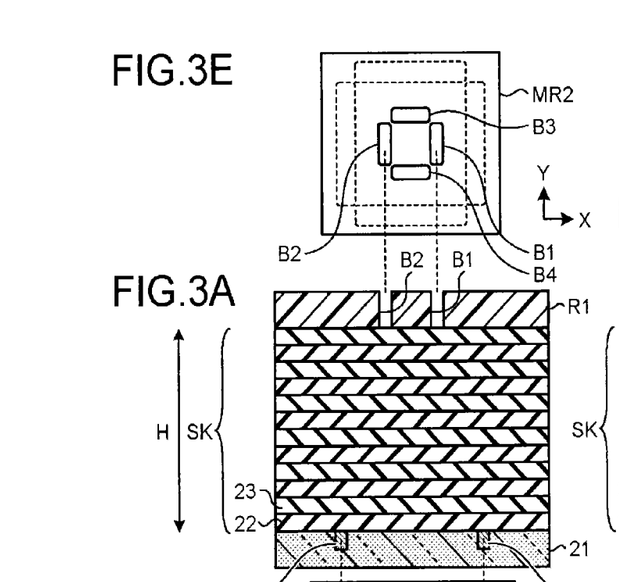
FIG. 3A is a cross-sectional view of a configuration example of a mark region MR1 in FIG. 2B at misalignment checking.
FIG. 3E is a plane view of a configuration example of a mark region MR2 to be superposed on the mark region MR1 at misalignment checking.
Figure 3B:
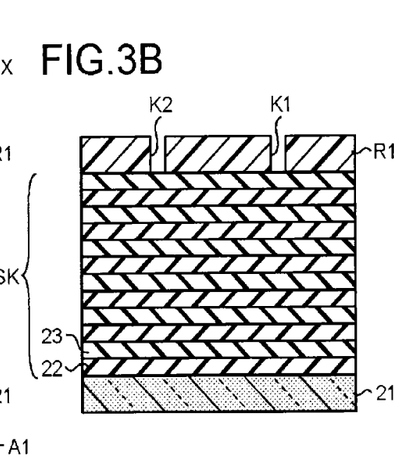
FIG. 3B is a cross-sectional view of a configuration example of a memory cell array region AR in FIG. 2B at misalignment checking.
Figure 3C:
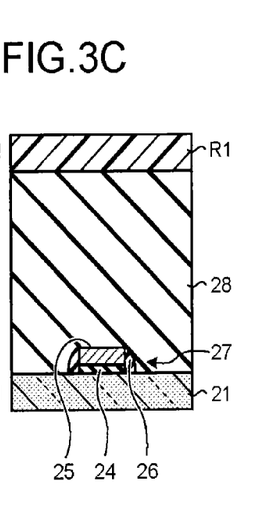
FIG. 3C is a cross-sectional view of a configuration example of a row decoder region LD in FIG. 2B at misalignment checking.
Figure 3D:
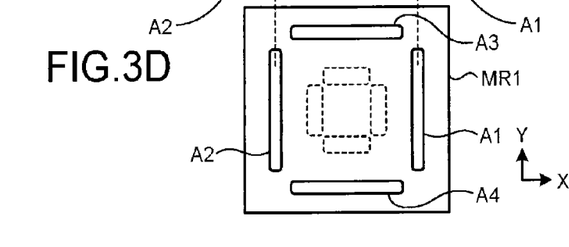
FIG. 3D is a plane view of a configuration example of the mark region MR1 in FIG. 2B at a misalignment checking.

FIG. 3A is a cross-sectional view of a configuration example of the mark region MR1 in FIG. 2B at misalignment checking, FIG. 3B is a cross-sectional view of a configuration example of the memory cell array region AR in FIG. 2B at misalignment checking, FIG. 3C is a cross-sectional view of a configuration example of the row decoder region LD in FIG. 2B at misalignment checking, FIG. 3D is a plane view of a configuration example of the mark region MR1 in FIG. 2B at a misalignment checking, and FIG. 3E is a plane view of a configuration example of the mark region MR2 to be superposed on the mark region MR1 at misalignment checking.

Referring to FIGS. 3A to 3C, a base layer 21 is provided in the memory cell array region AR, the row decoder region LD, the sense amplifier region SA, and the mark regions MR1 illustrated in FIG. 2B. The base layer 21 may be a semiconductor substrate, a wiring layer, or an insulator. As illustrated in FIGS. 3A and 3D, misalignment detection marks A1 to A4 are formed on the base layer 21 in the mark region MR1. The misalignment detection marks A1 to A4 may be arranged at the four sides of a square, for example. At that time, the misalignment detection marks A1 and A2 may be arranged along a Y axis, and the misalignment detection marks A3 and A4 may be arranged along an X axis. The misalignment detection marks A1 to A4 may be composed of materials different from that for the base layer 21. For example, when the base layer 21 is a semiconductor, the misalignment detection marks A1 to A4 may be composed of an insulator such as oxide silicon. When the base layers A1 is an insulator, the misalignment detection marks A1 to A4 may be composed of a semiconductor such as polycrystalline silicon or a metal such as Al or Cu. A layered body SK is formed on the base layer 21 in the mark region MR1. The layered body SK includes insulating layers 22 and 23 which are made of different materials and are layered alternately. The insulating layers 22 and 23 may be formed from material permeable to illumination light from the light source 2. For example, the insulating layers 22 may be silicon oxide films, and the insulating layers 23 may be silicon nitride films. A mask pattern R1 is formed on the layered body SK in the mark region MR1. The mask pattern R1 may be formed from a material permeable to illumination light from the light source 2. The mask pattern R1 may be a resist pattern or a hard mask pattern. The mask pattern R1 is provided with the mark region MR2. The mark region MR2 may be superimposed on the mark region MR1. The mark region MR2 has misalignment detection marks B1 to B4. The misalignment detection marks B1 to B4 may be provided by forming openings in the mask pattern R1. The misalignment detection marks B1 to B4 may be arranged at the four sides of a square, for example. At that time, the misalignment detection marks B1 and B2 may be arranged along the Y axis, and the misalignment detection marks B3 and B4 may be arranged along the X axis. The square with the misalignment detection marks B1 to B4 at the four sides may be positioned similarly inside the square with the misalignment detection marks A1 to A4 at the four sides.

As illustrated in FIG. 3B, the layered body SK is formed on the base layer 21 in the memory cell array region AR. The mask pattern R1 is formed on the layered body SK in the memory cell array region AR. In the memory cell array region AR, openings K1 and K2 are formed on the mask pattern R1.

As illustrated in FIG. 3C, a transistor 27 is formed on the base layer 21 in the row decoder region LD. The transistor 27 may be provided with a gate insulating film 24, a gate electrode 25, and a side wall 26. An inter-layer insulating film 28 is formed on the transistor 27. The material for the inter-layer insulating film 28 may be a silicon oxide film, for example. The mask pattern R1 is formed on the inter-layer insulating film 28.

When the mask pattern R1 is formed on the layered body SK and the inter-layer insulating film 28, the wafer N is arranged on the wafer stage 1 illustrated in FIG. 1. The light source 2 emits illumination light which is then collected on the illumination lens Z2. The illumination light then enters the object lens 21 via the half mirror B1 and is collected on the wafer W. At that time, when the illumination light enters the misalignment detection marks A1 to A4 and B1 to B4, the illumination light is reflected on the misalignment detection marks A1 to A4 and B1 to B4. Then, the reflection light from the misalignment detection marks A1 to A4 and B1 to B4 enters the imaging lens Z3 via the object lens Z1 and the half mirror B1, and then is branched by the beam splitter 82 to generate branch lights LB1 and LB2. The branch light LB1 enters the imaging element J1 via the filter F1 and forms an image on imaging surface of the imaging element J1. The branch light LB2 enters the imaging element J2 via the filter F2 and forms an image on an imaging surface of the imaging element J2. The images from the imaging elements J1 and J2 are sent to the image processing unit 3, and edges of the misalignment detection marks A1 to A4 and B1 to B4 are extracted.

At that time, the image processing unit 3 detects the edges of the misalignment detection marks A1 to A4 from the image from the imaging element J1, and detects the edges of the misalignment detection marks A2 to A2 from the image of the imaging element J2. In this case, the passband of the filter F1 may be set to sharpen the edges of the detection marks A1 to A4, and the passband of the filter F2 may be set to sharpen the edges of the detection marks B1 to B4. When no edges of the misalignment detection marks A1 to A4 and B1 to B4 can be extracted, the wafer drive unit 4 is controlled via the drive control unit 5. Then, the wafer stage 1 is moved upward or downward in the Z-axis direction to extract the edges of the misalignment detection marks A1 to A4 and B1 to B4. When the edges of the misalignment detection marks A1 to A4 and B1 to B4 are extracted, the element drive units N1 and N2 are controlled via the drive control unit 5. Then, the imaging element J1 is moved in the direction of its optical axis to sharpen the edges of the misalignment detection marks A1 to A4, and the imaging element J2 is moved in the direction of its optical axis to sharpen the edges of the misalignment detection marks B1 to B4. After that, the image processing unit 3 superimposes the edges of the misalignment detection marks A1 to A4 and B1 to B4. Then, the arithmetic processing unit 6 calculates misalignments between the misalignment detection marks A1 to A4 and B1 to B4 according to the positions of the edges of the misalignment detection marks A1 to A4 and B1 to B4. The misalignments between the misalignment detection marks A1 to A4 and B1 to B4 may be calculated, for example, by calculating a first barycentric position of the misalignment detection marks A1 to A4 and a second barycentric position of the misalignment detection marks B1 to B4, and then comparing the first barycentric position and the second barycentric position. Otherwise, the misalignments may be calculated by calculating a first distance between the misalignment detection marks A1 and B1, a second distance between the misalignment detection marks A2 and B2, a third distance between the misalignment detection marks A3 and B3, and a fourth distance between the misalignment detection marks A4 and B4, and comparing the first and second distances to calculate a misalignment in the Y-axis direction, and then comparing the third and fourth distances to calculate a misalignment in the Z-axis direction. When the misalignments between the misalignment detection marks A1 to A4 and B1 to B4 are calculated, the misalignments are displayed on the display unit.

Imaging the misalignment detection marks A1 to A1 and B1 to B4 having different focus positions at the same time by the imaging elements J1 and J2 makes it possible to set imaging environments suited for the misalignment detection marks A1 to A4 and B1 to B4 without having to moving the wafer stage 1 upward or downward in the Z-axis direction for each of the misalignment detection marks A1 to A4 and B1 to B4. This achieves improvement in throughput with maintenance of the accuracy for checking misalignments between the misalignment detection marks A1 to A4 and B1 to B4. In addition, providing the filters F1 and F2 in front of the imaging elements J1 and J2 makes it possible to eliminate wavelength regions unnecessary for imaging of the misalignment detection marks A1 to A4 and B1 to B4. This achieves improvements in the accuracy of checking misalignments between the misalignment detection marks A1 to A4 and B1 to B4.

Figure 4:
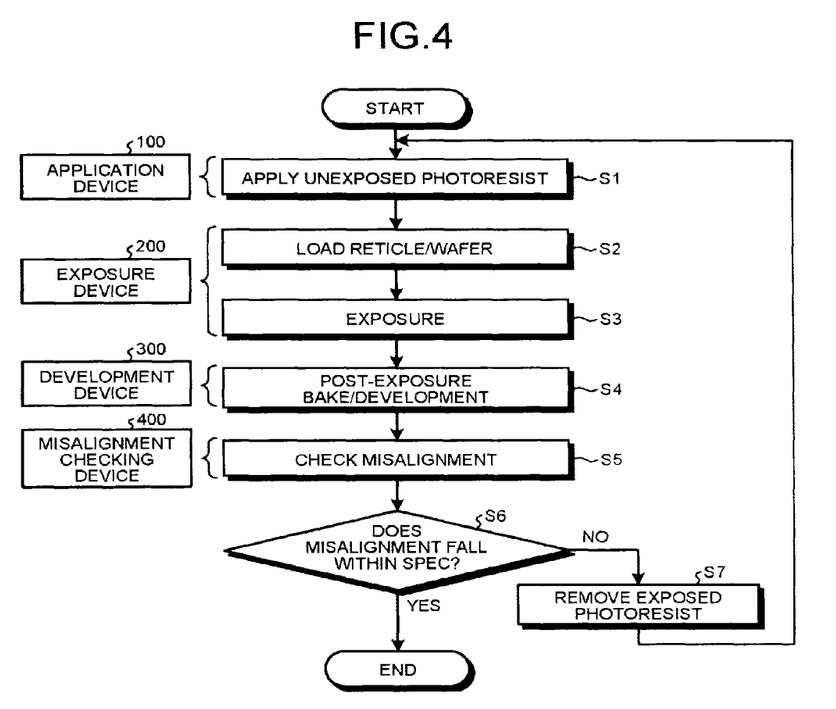
FIG. 4 is a flowchart of an example of a lithography process to which the misalignment checking device illustrated in FIG. 1 is applied.

FIG. 4 is a flowchart of an example of lithography process to which the misalignment checking device illustrated in FIG. 1 is applied.

Referring to FIG. 4, a photoresist is applied to the wafer W at an application device 100 (S1). Next, a reticle and the wafer W are loaded to an exposure device 200 (S2). The photoresist on the wafer W is irradiated with exposure light to expose the photoresist on the wafer W to light (S3). Then, a developing device 300 performs post-exposure bake and development to form a resist pattern R1 on the wafer W (S4). The misalignment checking device 400 illustrated in FIG. 1 measures misalignments between the misalignment detection marks A1 to A4 and B1 to B4 (S5). The misalignment checking device 400 determines whether the misalignments between the misalignment detection marks A1 to A4 and B1 to B4 fall within a specified range (S6). When the misalignments do not fall within the specified range, the misalignment checking device 400 removes the resist pattern R1 (S7), and returns the process to S1. The steps S1 to S7 are repeatedly carried out until the misalignments between the misalignment detection marks A1 to A4 and B1 to B4 on the wafer W falls within the specified range.

(Second Embodiment)

Figure 5:
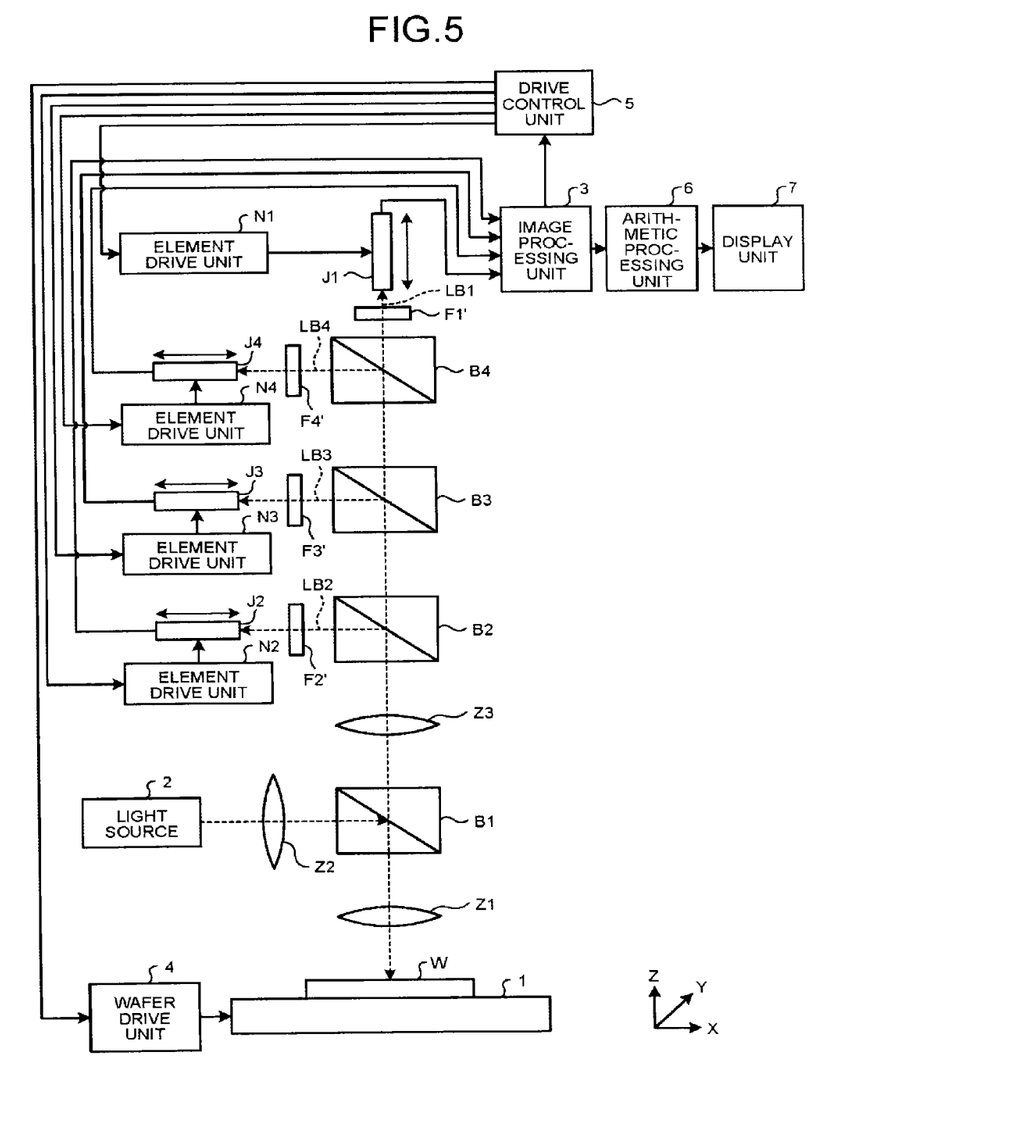
FIG. 5 is a schematic block diagram of a schematic configuration example of a misalignment checking device according to a second embodiment.

FIG. 5 is a schematic block diagram of a configuration example of a misalignment checking device according to a second embodiment.

In the configuration of FIG. 5, beam splitters B3 and B4, imaging elements J3 and J4, and element drive units N3 and N4 are added to the configuration of FIG. 1. In addition, instead of the filters F1 and 82 of FIG. 1, filters F1' to F4' are provided. The beam splitters B3 and 84 branch reflection light from the wafer W. The imaging elements J3 and J4 capture images of patterns different in focus position on the wafer W. At that time, the imaging elements J1 and J3 capture images of a pattern in the X-axis direction and a pattern in the Y-axis direction, at a first focus position, respectively. The imaging elements J2 and J4 capture images of a pattern in the X-axis direction and a pattern in the Y-axis direction, at a second focus position, respectively. The filter F1' selects a wavelength region suited for imaging by the imaging element J1 or selects light of polarization suited for imaging the pattern in the X-axis direction. The filter F2' selects a wavelength region suited for imaging by the imaging element J2 or selects light of polarization suited for imaging the pattern in the X-axis direction. The filter F3' selects a wavelength region suited for imaging by the imaging element J3 or selects light of polarization suited for imaging the pattern in the Y-axis direction. The filter F4' selects a wavelength region suited for imaging by the imaging element J4 or selects light of polarization suited for imaging the pattern in the Y-axis direction. The element drive unit N3 drives the imaging element J3 in the direction of an optical axis of the imaging element J3. The element drive unit N4 drives the imaging element J4 in the direction of an optical axis of the imaging element J4.

When the mask pattern R1 illustrated in FIGS. 3A to 3C is formed on the layered body SK and the inter-layer insulating film 28, the wafer W is placed on the wafer stage 1 of FIG. 5. The light source 2 emits illumination light which is then collected on the illumination lens Z2. The illumination light enters the object lens Z1 via the half mirror B1 and is collected on the wafer W. The illumination light enters the misalignment detection marks A1 to A4 and B1 to B4, and then is reflected on the misalignment detection marks A1 to A4 and B1 to B4. The reflection light from the misalignment detection marks A1 to A4 and B1 to B4 enters the imaging lens Z3 via the object lens Z1 and the half mirror B1, and then branched by the beam splitters B2 to B4 to generate branch lights LB1 to LB4. The branch light LB1 enters the imaging element J1 via the filter F1' and forms an image on the imaging surface of the imaging element J1. The branch light LB2 enters the imaging element J2 via the filter F2' and forms an image on the imaging surface of the imaging element J2. The branch light LB3 enters the imaging element J3 via the filter F3' and forms an image on the imaging surface of the imaging element J3. The branch light LB4 enters the imaging element J4 via the filter F4' and forms an image the imaging surface of the imaging element J4. The images captured by the imaging elements J1 to J4 are sent to the image processing unit 3 where the edges of the misalignment detection marks A1 to A4 and B1 to B4 are extracted.

At that time, the image processing unit 3 detects the edges of the misalignment detection marks A3 and A4 from the image captured by the imaging element J1, detects the edges of the misalignment detection marks B3 and B4 from the image captured by the imaging element J2, detects the edges of the misalignment detection marks A1 and A2 from the image captured by the imaging element J3, and detects the edges of the misalignment detection marks B1 and B2 from the image captured by the imaging element J4. In this case, the passband and direction of polarization of the filter F1' are set to sharpen the edges of the detection marks A3 and A4, the passband and direction of polarization of the filter B2' are set to sharpen the edges of the detection marks B3 and B4, the passband and direction of polarization of the filter F3' are set to sharpen the edges of the detection marks A1 and A2, and the passband and direction of polarization of the filter F4' are set to sharpen the edges of the detection marks B1 and B2. When no edges of the misalignment detection marks A1 to A4 and B1 to B4 can be extracted, the wafer drive unit 4 is controlled via the drive control unit 5. Then, the wafer stage 1 is moved upward or downward in the Z-axis direction to detect the edges of the misalignment detection marks A1 to A4 and B1 to B4. When the edges of the misalignment detection marks A1 to A4 and B1 to B4 are extracted, the element drive units N1 and N2 are controlled via the drive control unit 5. Then, the imaging element J1 is moved in the direction of an optical axis thereof to sharpen the edges of the misalignment detection marks A3 and A4, the imaging element J2 is moved in the direction of an optical axis thereof to sharpen the edges of the misalignment detection marks B3 and B4, and the imaging element J3 is moved in the direction of an optical axis thereof to sharpen the edges of the misalignment detection marks A1 and A2, and the imaging element J4 is moved in the direction of an optical axis thereof to sharpen the edges of the misalignment detection marks B1 and B2. After that, the image processing unit 3 superimposes the edges of the misalignment detection marks A1 to A4 and B1 to B4. Then, the arithmetic processing unit 6 calculates misalignments between the misalignment detection marks A1 to A4 and B1 B4 according to the positions of the edges of the misalignment detection marks A1 to A4 and B1 to B4. When the misalignments between the misalignment detection marks A1 to A4 and B1 to B4 are calculated, the misalignments are displayed on the display unit 7.

Imaging the misalignment detection marks A1 to A4 and B1 to B4 different in focus position and pattern direction at the same time by the imaging elements J1 to J4 makes it possible to set imaging environments suited for the misalignment detection marks A1 to A4 and B1 to B4 without having to moving the wafer stage 1 upward or downward in the Z-axis direction for each of the misalignment detection marks A1 to A4 and B1 to B4. This achieves improvement in throughput with maintenance of the accuracy for checking misalignments between the misalignment detection marks A1 to A4 and B1 to B4. In addition, providing the filters F1' to F4' in front of the imaging elements J1 to J4 makes it possible to remove a wavelength region unnecessary for imaging of the misalignment detection marks A1 to A4 and B1 to B4 and optimize the direction of polarization in the passband. This achieves improvement in the accuracy of checking the misalignments between the misalignment detection marks A1 to A4 and B1 to B4.

(Third Embodiment)

Figure 6:
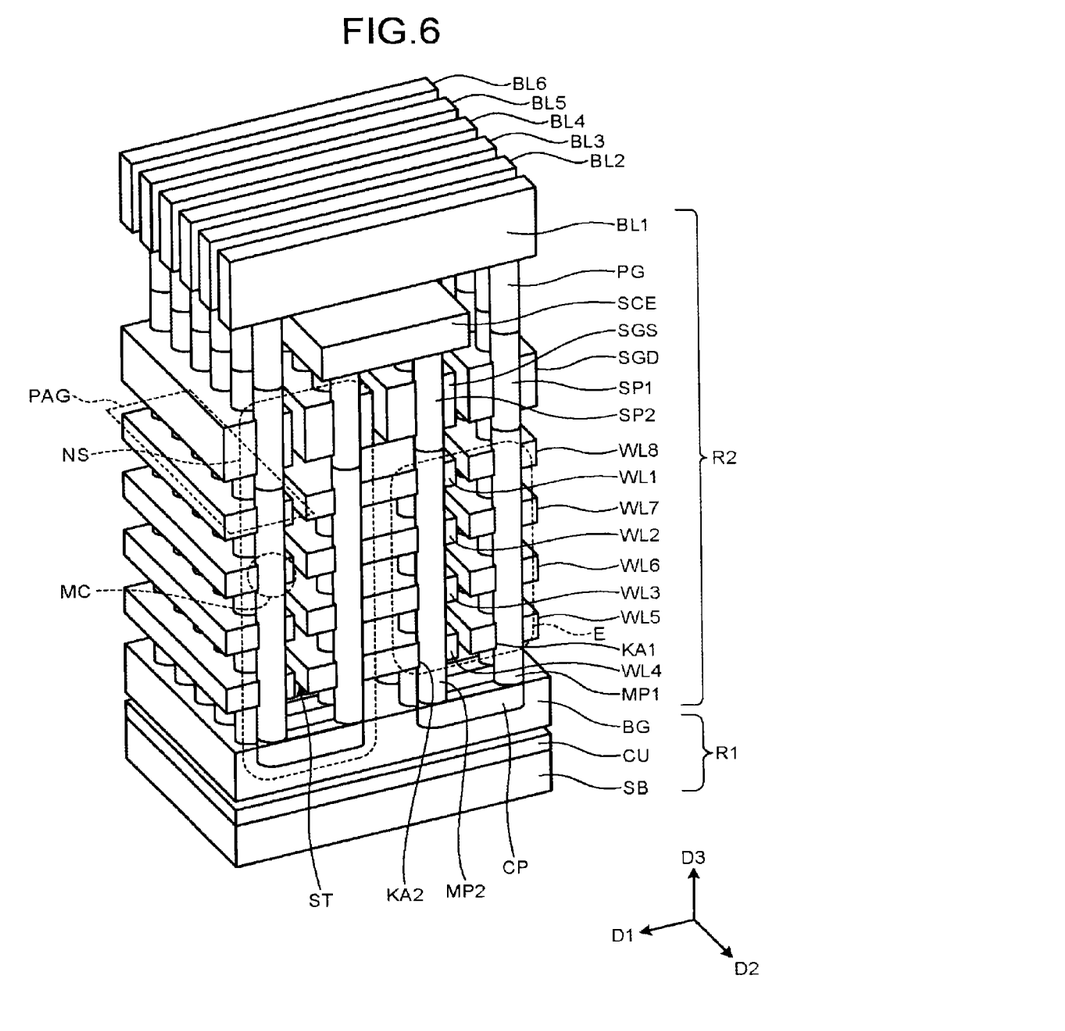
FIG. 6 is a schematic perspective view of a schematic configuration example of a memory cell array in a non-volatile semiconductor storage device to which a misalignment checking device according to a third embodiment is applied at the time of manufacture.

FIG. 6 is a schematic perspective view of a configuration example of a memory cell array in a non-volatile semiconductor storage device to which a misalignment checking device according to a third embodiment is applied at the time of manufacture. The memory cell array is formed in the memory cell array region AR illustrated in FIG. 2B. In the example of FIG. 6, four layered memory cells MC are turned back at the lower end and eight memory cells MC are connected in series to form an NAND string NS. In addition, in the example of FIG. 6, no inter-layer insulating films between the word lines WL1 to WL4 and between word lines WL5 to WL8 are illustrated.

Referring to FIG. 6, a circuit region R1 is provided on a semiconductor substrate SB, and a memory region R2 is provided on the circuit region R1. Alternatively, the circuit region R1 and the memory region R2 may be provided on separate substrates.

A circuit layer CU is formed on the semiconductor substrate SB in the circuit region R1. A back gate layer BG is formed on the circuit layer CU, and a connection layer CP is formed on the back gate layer BG. Columnar bodies MP1 and MP2 are arranged adjacent to each other on the connection layer CP, and are connected together at lower ends thereof via the connection layer CP. In addition, four layers of the word lines WL4 to WL1 and inter-layer insulating films are alternately layered on the connection layer CP in a layering direction D3, and four layers of the word lines WL5 to WL8 and inter-layer insulating films are alternately layered in the layering direction D3 so as to be adjacent to the word lines WL4 to WL1, respectively. The word lines WL1 to WL8 may be composed of impurity-added silicon layers or tungsten layers, for example. A select gate line SGS is layered on the top word line WL1 via an inter-layer insulating film, and a select gate line SGD is layered on the top word line WL8 via an inter-layer insulating film. The select gate lines SGS and SGD may be composed of impurity-added silicon layers or tungsten layers, for example.

The layered body has a memory hole KA2 penetrating through the word lines WL4 to WL1 and the select gate line SGS, and has a memory hole KA1 penetrating through the word lines WL5 to WL8 and the select gate line SGD. The columnar body MP1 passes through the word lines WL5 to WL8 via the memory hole KA1 to form the memory cell MC for each of the word lines WL5 to WL8. The columnar body MP2 passes through the word lines WL1 to WL4 via the memory hole KA2 to form the memory cell MC for each of the word lines WL1 to WL4. A slit ST is formed between the word lines WL1 to WL4 and the word lines WL5 to WL8 to divide the word lines WL1 to WL8 into pages PAG. The page PAG refers to a unit of data to be written into the memory cell MC and a unit of data to be read from the memory cell MC. The word lines WL1 to WL8 may be formed in a row direction D2. Columnar bodies SP1 and SP2 are formed on the columnar bodies MP1 and MP2, respectively. The columnar body SP1 passes through the select gate line SGD via the memory hole KA1 and the columnar body SP2 passes through the select gate line SGS via the memory hole KA2, thereby to form the NAND string NS.

A source line SCE is connected to the columnar body SP2 on the select gate line SGS, and bit lines BL1 to BL6 are connected to the columnar body SP1 via a plug PG or the source line SCE in the column direction D1. The columnar bodies MP1 and MP2 may be arranged at the points of intersections between the bit lines BL1 to BL6 and the word lines WL1 to WL6.

Figure 7:
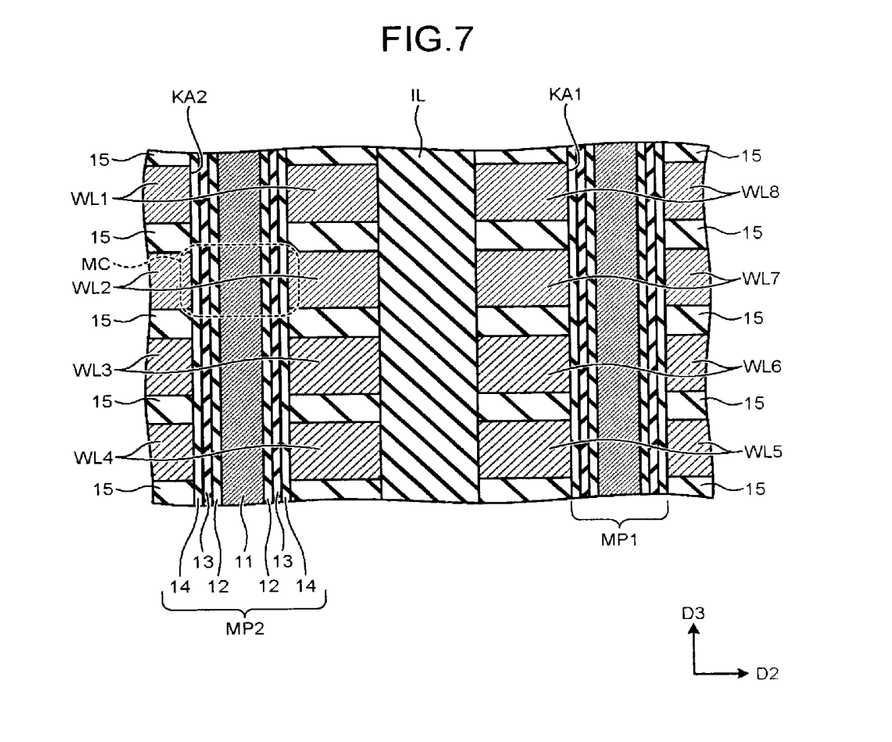
FIG. 7 is an enlarged cross-sectional view of a section E in FIG. 6.

FIG. 7 is an enlarged cross-sectional view of a section E in FIG. 6.

Referring to FIG. 7, an insulating body IL is embedded between the word lines WL1 to WL4 and the word lines WL5 to WL8. Inter-layer insulating films 15 are formed between the word lines WL1 to WL4 and between the word lines WL5 WL8. The memory hole KA2 is formed in the word lines WL1 to WL4 and the inter-layer insulating films 15 to penetrates through these lines and films in the layering direction D3, and the memory hole KA1 is formed in the word lines WL5 to WL8 and the inter-layer insulating films 15 to penetrate through these lines and films in the layering direction D3. The columnar body MP1 is formed in the memory hole KA1 and the columnar body MP2 is formed in the memory hole KA2.

Columnar semiconductors 11 are formed in the columnar bodies MP1 and MP2 at the centers thereof. Tunnel insulating films 12 are formed between the inner surfaces of the memory holes KA1 and KA2 and the columnar semiconductors 11. Charge trap layers 13 are formed between the inner surfaces of the memory holes KA1 and KA2 and the tunnel insulating films 12. Block insulating films 14 are formed between the inner surfaces of the memory holes KA1 and KA2 and the charge trap layers 13. The columnar semiconductors 11 may be Si, for example. The tunnel insulating films 12 and the block insulating films 14 may be silicon oxide films, for example. The charge trap layers 13 may be silicon nitride films, or ONO films (three-layer structure of silicon oxide film/silicon nitride film/silicon oxide film), or ONOS films (four-layer structure of silicon oxide film/silicon nitride film/silicon oxide film/silicon oxynitride film), for example.

FIGS. 8A, 8B, 9A, and 9B are cross-sectional views illustrating a manufacturing method of the memory cell array in the non-volatile semiconductor storage device according to the third embodiment.

Figure 8A:
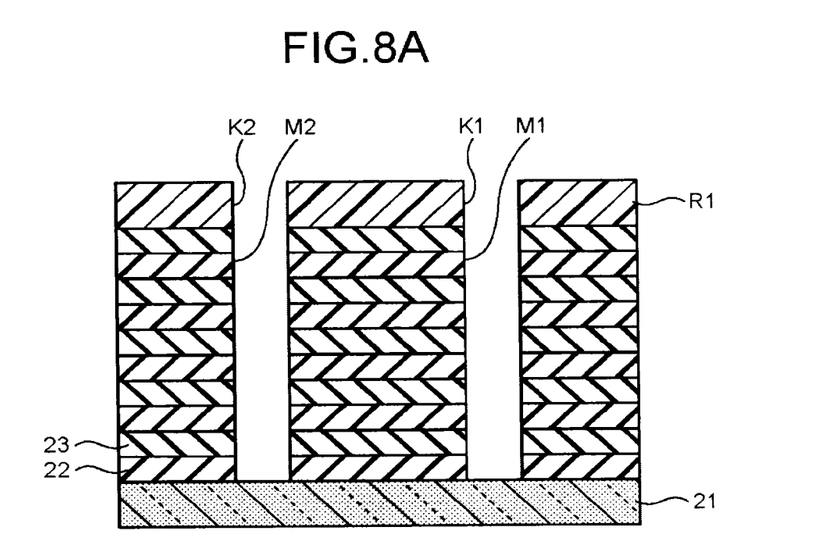
FIGS. 8A and 8B are cross-sectional views illustrating a manufacturing method of the memory cell array in the non-volatile semiconductor storage device according to the third embodiment.

Referring to FIG. 8A, when the misalignments between the misalignment detection marks A1 to A4 and B1 to B4 fall within the specified range at S6 of FIG. 4, the layered body SK of FIG. 3B is etched through the openings K1 and K2 to form memory holes M1 and M2 in the layered body SK.

Figure 8B:
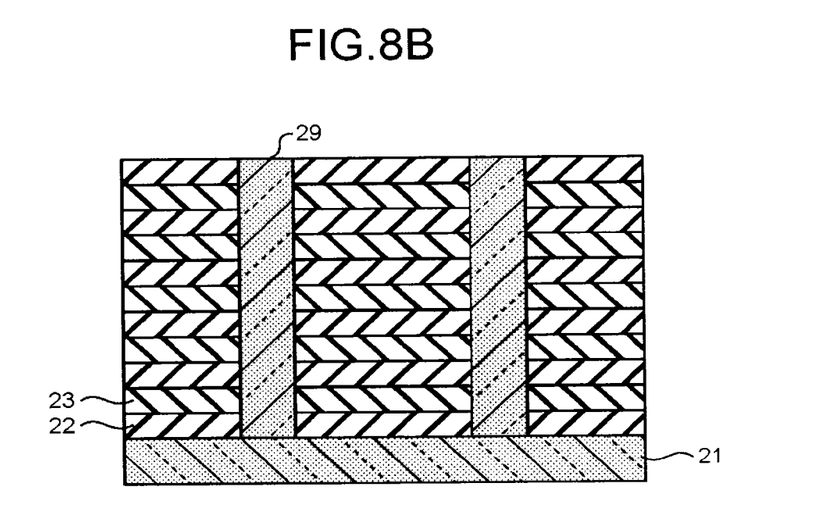

Next, as illustrated in FIG. 8B, columnar bodies 29 are embedded into the memory hole M1 and M2 by CVD method or the like. The columnar bodies 29 may be configured in the same manner as the columnar body MP2 illustrated in FIG. 7.

Figure 9A:
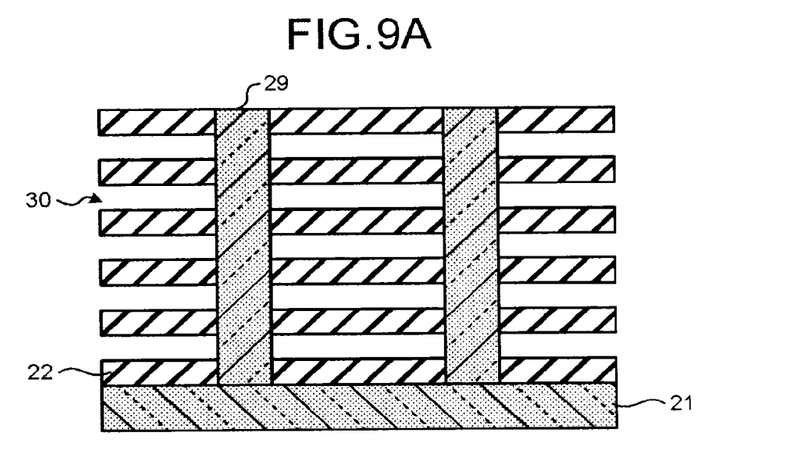
FIGS. 9A and 9B are cross-sectional views illustrating the manufacturing method of the memory cell array in the non-volatile semiconductor storage device according to the third embodiment.

As illustrated in FIG. 9A, the insulating layers 23 are selectively etched by wet-etching or the like to form air gaps 30 between the insulating layers 22.

Figure 9B:
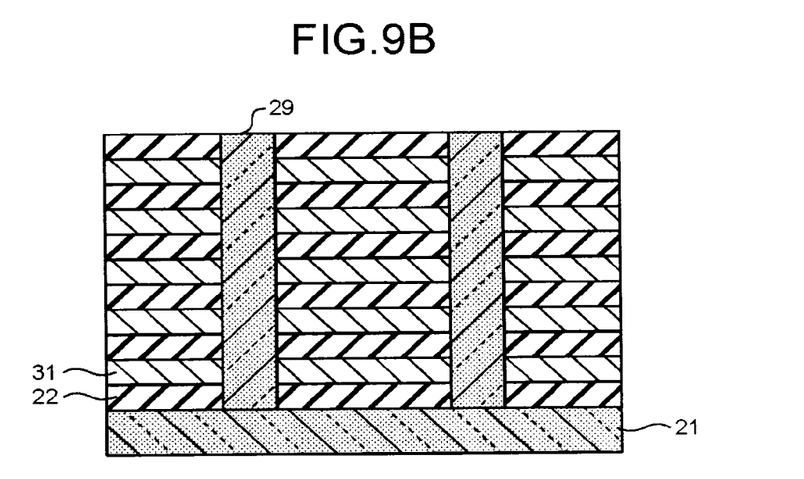

As illustrated in FIG. 9B, conducive films 31 are embedded into the air gaps 30 by ALD-CVD method or the like. The material for the conductive films 31 may be tungsten, for example. The insulating layers 22 may be used as the inter-layer insulating films 15 of FIG. 7. The conductive films 31 may be used as the word lines WL1 to WL8 of FIG. 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form the embodiments described herein may be made without departing from the spirit of the inventions. The accompanying claims and their equivalents are intended to cover such forms or modifications as would fall within the scope and spirit of the inventions.

What is claimed is:

1. A misalignment checking device, comprising:
an optical element configured to branch reflection light from a first mark and a second mark which have different focus positions;
a first imaging element configured to capture an image of the first mark based on a first branch light branched by the optical element, the first imaging element being either CCDs or CMOS image sensors;
a second imaging element configured to capture an image of the second mark based on a second branch light branched by the optical element, the second imaging element being either CCDs or CMOS image sensors;
a light source that generates illumination light to illuminate the first mark and the second mark;
an object lens that collects the illumination light on the first mark and the second mark;
an illumination lens that collects the illumination light emitted from the light source;
an imaging lens that collects the illumination light on the first imaging element and the second imaging element;
a half mirror that reflects the illumination light emitted from the first mark and the second mark or lets the reflection light from the first mark and the second mark pass therethrough;
an arithmetic processing unit configured to calculate a misalignment between the first mark and the second mark based on a result of superimposition of the image of the first mark and the image of the second mark;
a first drive unit configured to drive the first imaging element in a direction of an optical axis of the first imaging element;
a second drive unit configured to drive the second imaging element in a direction of an optical axis of the second imaging element;
an image processing unit configured to extract edges of the image of the first mark and the image of the second mark;
a drive control unit configured to control driving of the first drive unit and the second drive unit to sharpen the edges and to control driving of the wafer drive unit such that the wafer is held at a height at which the first mark and the second mark are observable at the same time;
a wafer drive unit configured to drive vertically a wafer stage holding a wafer on which the first mark and the second mark are formed;
a first filter provided in front of the first imaging element to select a wavelength region suited for imaging of the first mark; and
a second filter provided in front of the second imaging element to select a wavelength region suited for imaging of the second mark.

2. A misalignment checking device, comprising:
an optical element configured to branch reflection light from a first mark in an X-axis direction and a second mark in a Y-axis direction at a first focus position and branches reflection light from a third mark in the X-axis direction and a fourth mark in the Y-axis direction at a second focus direction;
a first imaging element configured to capture an image of the first mark based on a first branch light branched by the optical element, the first imaging element being either CCDs or CMOS image sensors;
a second imaging element configured to capture an image of the second mark based on a second branch light branched by the optical element, the second imaging element being either CCDs or CMOS image sensors;
a third imaging element configured to capture an image of the third mark based on a third branch light branched by the optical element, the third imaging element being either CCDs or CMOS image sensors;
a fourth imaging element configured to capture an image of the fourth mark based on a fourth branch light branched by the optical element, the fourth imaging element being either CCDs or CMOS image sensors;
a light source that generates illumination light to illuminate the first to the fourth marks;
an object lens that collects the illumination light on the first to the fourth marks;
an illumination lens that collects the illumination light emitted from the light source;

an imaging lens that collects the illumination light on the first to the fourth imagine elements;

a half mirror that reflects the illumination light emitted from the first to the fourth marks or lets the reflection light from the first to the fourth marks pass therethrough;

an arithmetic processing unit configured to calculate a misalignment between the first mark and the third mark and a misalignment between the second mark and the fourth mark, based on a result of superimposition of the imaaes of the first to fourth marks;

a first drive unit configured to drive the first imaging element in a direction of an optical axis of the first imaging element;

a second drive unit configured to drive the second imaging element in a direction of an optical axis of the second imaging element;

a third drive unit configured to drive the third imaging element in a direction of an optical axis of the third imaging element;

a fourth drive unit configured to drive the fourth imaging element in a direction of an optical axis of the fourth imaging element;

an image processing unit configured to extract each of edges of the images of the first to fourth marks;

a drive control unit configured to control driving of the first to fourth drive units to sharpen the edges and to control driving of the wafer drive unit such that the wafer is held at a height at which the first to fourth marks are observable at the same time;

a wafer drive unit configured to drive vertically a wafer on which the first to fourth marks are formed;

a first filter provided in front of the first imaging element to select a wavelength region suited for imaging of the first mark;

a second filter provided in front of the second imaging element to select a wavelength region suited for imaging of the second mark;

a third filter provided in front of the third imaging element to select a wavelength region suited for imaging of the third mark; and a fourth filter provided in front of the fourth imaging element to select a wavelength region suited for imaging of the fourth mark.

* * * * *